(12) United States Patent
Lee

(10) Patent No.: US 7,675,128 B2
(45) Date of Patent: Mar. 9, 2010

(54) METHOD FOR FORMING A GATE INSULATING LAYER OF A SEMICONDUCTOR DEVICE

(75) Inventor: Young Seong Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/352,374

(22) Filed: Jan. 12, 2009

(65) Prior Publication Data

US 2009/0127671 A1   May 21, 2009

Related U.S. Application Data

(62) Division of application No. 11/616,284, filed on Dec. 26, 2006, now Pat. No. 7,494,879.

(30) Foreign Application Priority Data

Dec. 28, 2005   (KR)   ............... 10-2005-0131666

(51) Int. Cl.
*H01L 21/8238*   (2006.01)
(52) U.S. Cl. ............... 257/410; 257/411; 257/E21.625
(58) Field of Classification Search .............. 438/216, 438/275, 287; 257/325, 345, 349, 410, 411, 257/E21.625
See application file for complete search history.

(56) References Cited

U.S. PATENT DOCUMENTS

| 6,136,654 A | 10/2000 | Kraft et al. |
| 6,784,060 B2 | 8/2004 | Ryoo |
| 2001/0052618 A1* | 12/2001 | Hasegawa ................ 257/345 |
| 2004/0102010 A1 | 5/2004 | Khamankar et al. |

\* cited by examiner

*Primary Examiner*—W. David Coleman
*Assistant Examiner*—Shaka Scarlett
(74) *Attorney, Agent, or Firm*—Sherr & Vaughn, PLLC

(57) ABSTRACT

Embodiments relate to a method for forming a gate insulating layer, which may include forming a device isolation layer being divided into a device active region and a device isolation region, growing a first oxide layer at an entire surface of the semiconductor substrate as a gate insulating layer, performing a first annealing process to form a diffusion barrier layer an interface between the first oxide layer and the device active region, etching and removing a first oxide layer and a diffusion barrier layer of the core power source wiring region by masking the input/output power source wiring region, growing a second oxide layer on the core power source wiring region, and performing a second annealing process to form an NO gate oxide layer on which an N-rich oxide layer at an interface of the core power source wiring region.

8 Claims, 4 Drawing Sheets

METHOD FOR FORMING A GATE INSULATING LAYER OF A SEMICONDUCTOR DEVICE

The present application is a divisional of U.S. patent application Ser. No. 11/616,284 filed Dec. 26, 2006 now U.S. Pat. No. 7,494,879, which claims priority under 35 U.S.C. 119 and 35 U.S.C. 365 to Korean Patent Application No. 10-2005-0131666 (filed on Dec. 28, 2005), which are hereby incorporated by reference in their entireties.

BACKGROUND

As manufacturing technology of semiconductor devices develops, an ability to highly integrate semiconductor devices may become more advanced. As a degree of integration of semiconductor devices increases, there may be an interest in miniaturizing various components.

Moreover, as semiconductor devices become more highly integrated, a wiring line width of a gate electrode or bit lines of a metal oxide semiconductor field effect transistor (referred to as 'MOSFET' hereinafter) may be reduced.

FIGS. 1A through 1D are example cross-sectional diagrams illustrating a related art process for manufacturing a MOSFET, including forming a gate insulating layer before forming a gate electrode.

Referring to FIGS. 1A through 1D, a gate insulating layer of a logic device may be designed to be divided into an input/output (I/O) power source wiring region and a core power source wiring region. These regions may have different thicknesses corresponding to an operating voltage.

Referring to FIG. 1A, a device isolation process may be performed for a silicon substrate, which may be semiconductor substrate 100, and may form device isolation layer 102. Device isolation layer 102 may be divided into a device active region and a device isolation region. Next, ions may be implanted in a surface of substrate 100 to form a well and to grow first oxide layer 104 as a gate insulating layer.

Referring to FIG. 1B, oxide layer 104 of the core power source wiring region may be removed by masking the I/O power source wiring region, for example through a wet etching method.

Referring to FIG. 1C, second oxide layer 106, which may have a thin/low thickness may be grown, and may be provided on the core power source wiring region.

Referring to FIG. 1D, nitrogen annealing may be performed to form a NO gate in which nitrogen-rich oxide layer 108 may be formed at an interface of the device active region.

An N trapping may occur at an interface between dual layers in the I/O power source wiring region. The greater a thickness of first oxide layer 104, the higher an occurrence rate of the trapping may be. Because of this, Si—N binding may be insufficiently formed to reduce an interface stress reduction performance, which may lead to an electric degradation.

Thereafter, doped polysilicon may be deposited as a conductive layer and a gate electrode may be formed by patterning and etching processes. A MOSFET may be completed through a series of processes, which may form lightly doped drain (LDD) regions, spacers, and source/drain (S/D).

In the related art MOSFET, because of a fineness of a semiconductor line width, so as to embody a core power source wiring region of high performance, it may be necessary to reduce a threshold voltage and a leakage occurrence due to a short channel effect.

To precisely control an LDD profile, an applied boundary of a thermal process using a furnace may be gradually limited.

In contrast to this, although a formation of an LDD profile of a graded junction structure may be necessary in the I/O power source wiring region to improve hot-carrier characteristics, as mentioned above, due to a possibility for characteristic degradation in the core power source wiring region, it may be difficult to embody an extension type LDD having a sufficient thermal energy.

In the related art, second oxide layer 106 may grow to a lower portion of first oxide layer 104 and may form a thick oxide layer over the input/output power source wiring region.

To secure excellent hot carrier injection (HCI) or negative bias temperature instability (NBTI) characteristics, it may be necessary to increase a thickness of a gate insulating layer in the I/O power source wiring region. However, when a thickness of the gate insulating layer is increased greater than a threshold value, an interface segregation of ions implanted in the lower channel region may be caused due to a stress in an interface of the device active region. This may change certain characteristics of a transistor. In a serious case, an active region of the device may be cracked.

SUMMARY

Embodiments relate to a method for forming a gate insulating layer of a semiconductor device.

Embodiments relate to a method for forming a gate insulating layer of a semiconductor device that may reduce an occurrence of a stress during a formation of a gate insulating layer in an I/O power source wiring region.

According to embodiments, a method for forming a gate insulating layer of a semiconductor device, the semiconductor device being divided in an input/output power source wiring region and a core power source wiring region, may include performing a device isolation process for the semiconductor substrate to form a device isolation layer, which may be divided into a device active region and a device isolation region, growing a first oxide layer at an entire surface of the semiconductor substrate as a gate insulating layer, performing a first annealing process to form a diffusion barrier layer an interface between the first oxide layer and the device active region, etching and removing a first oxide layer and a diffusion barrier layer of the core power source wiring region by masking the input/output power source wiring region, growing a second oxide layer on the core power source wiring region, and performing a second annealing process to form an NO gate oxide layer on which an N-rich oxide layer at an interface of the core power source wiring region.

DETAILED DESCRIPTION OF EMBODIMENTS

Embodiments may include growing a first oxide layer, and performing an annealing process under a nitrogen N atmosphere to form an N-rich oxide layer at an interface between the first oxide layer and a device active region. This may suppress a subsequent growth of an oxide layer.

FIGS. 2A through 2D are example cross-sectional diagrams illustrating a gate insulating layer of a semiconductor and a procedure for manufacturing a MOSFET according to embodiments. These figures may depict a process sequence for forming a gate insulating layer prior to a formation of a gate electrode.

Referring to FIGS. 2A through 2D, a gate insulating layer of a logic device may be designed to be divided into an input/output (I/O) power source wiring region and a core power source wiring region. These regions may have different thicknesses corresponding to an operational voltage.

Figure 1A:
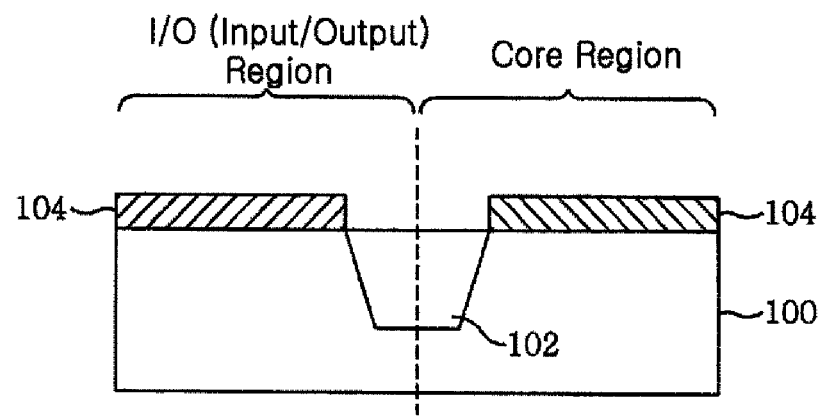
FIGS. 1A through 1D are example cross-sectional views showing a process for forming a gate insulating layer of a semiconductor device according to the related art.
Figure 1B:
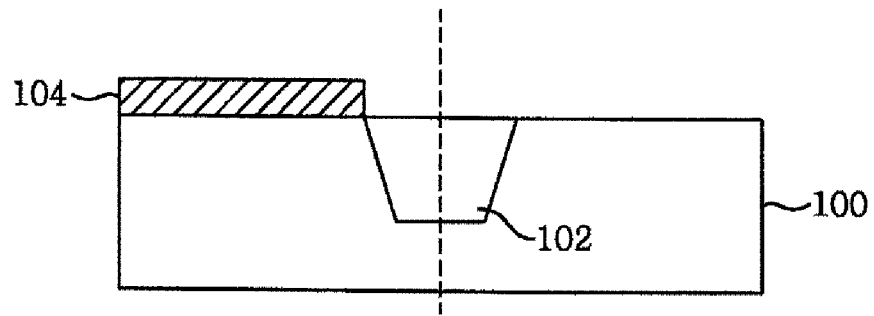
Figure 1C:
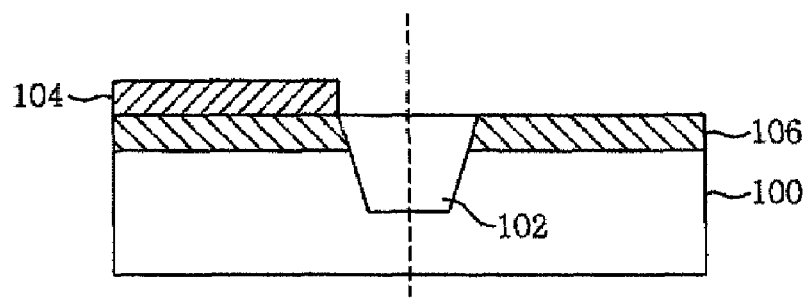
Figure 1D:
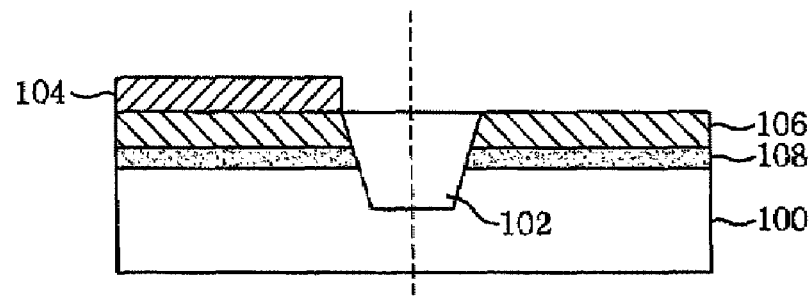
Figure 2A:
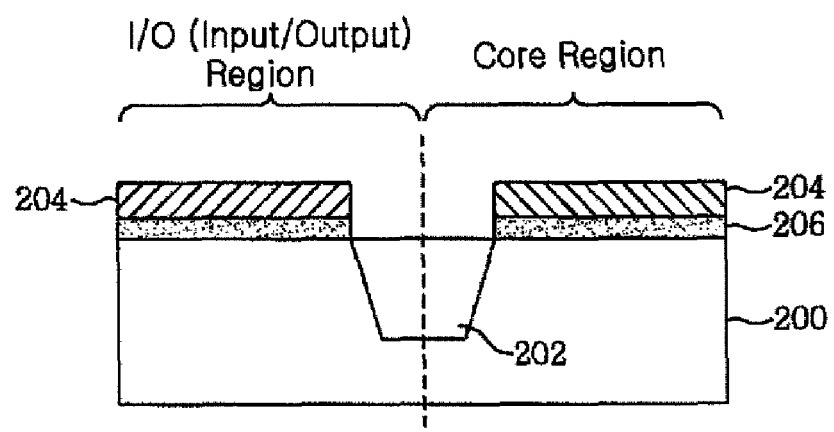
FIGS. 2A through 2D are example cross-sectional views of a gate insulating layer of a semiconductor device according to the present invention for describing a method for forming the gate insulating layer.

Referring to FIG. 2A, a device isolation process may be performed for a silicon substrate, which may be semiconductor substrate 200, and may form device isolation layer 202. Device isolation layer 202 may be divided into a device active region and a device isolation region. Next, ions may be implanted in a surface of substrate 200, and may form a well and grow first oxide layer 204 as a gate insulating layer.

According to embodiments, first oxide layer 204 may be grown. A first annealing process may be performed under a nitrogen N atmosphere, and may form N-rich oxide layer 206 at an interface between first oxide layer 204 and a device active region. For example, N-rich oxide layer 206 may have a thickness of several angstroms (Å) of a final thickness in the I/O power source wiring region. This is a minimum thickness to cause N-rich oxide layer 206 to function as a diffusion barrier layer, which prevents N-rich oxide layer 206 from subsequently growing to an interface of an oxide layer.

Figure 2B:
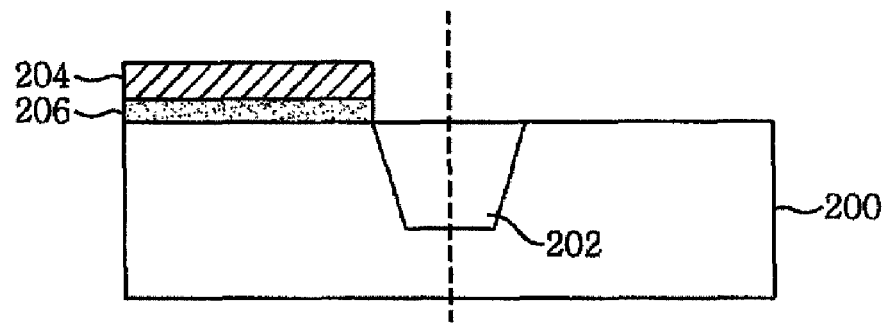

Referring to FIG. 2B, oxide layer 204 and N-rich oxide layer 206 of the core power source wiring region may be removed by masking the I/O power source wiring region, for example through a wet etching method.

Figure 2C:
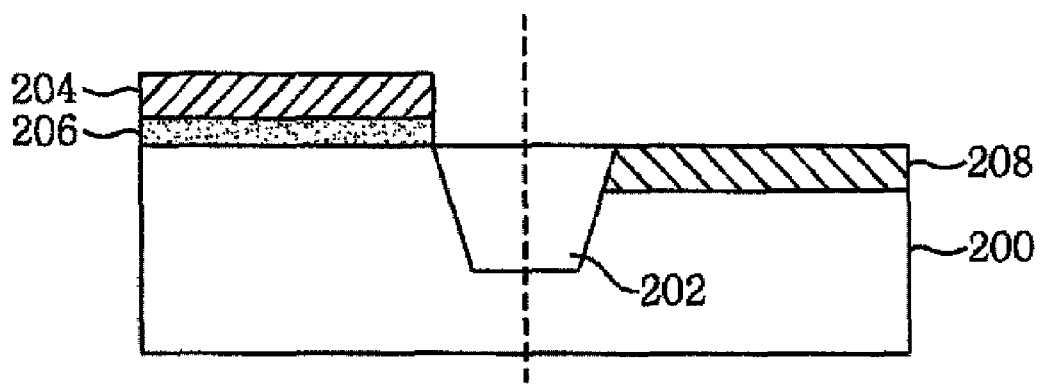

Referring to FIG. 2C, second oxide layer 208 of a narrow thickness, which may be provided only on the core power source wiring region, may be grown.

According to embodiments, a growth of second oxide layer 208 may be suppressed by N-rich oxide layer 206 in the I/O power source wiring region. Accordingly, second oxide layer 208 may not grow below a lower portion of first oxide layer 204, thereby preventing formation of a thick oxide layer. Thus, second oxide layer 208 may not be formed in the I/O power source wiring region.

Figure 2D:
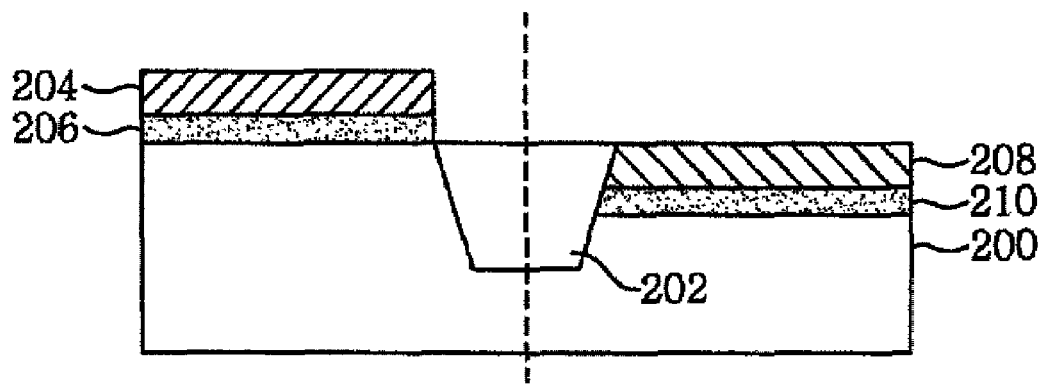

Referring to FIG. 2D, a second annealing process may be performed under a nitrogen N atmosphere. This may form a NO gate oxide layer on which N-rich oxide layer 210 may be formed at an interface of the core power source wiring region. For example, the N-rich oxide layer may be formed between the second oxide layer and the substrate on the core power source wiring region. Moreover, the second oxide region and the N-rich oxide layer may be formed below a level of the first oxide layer and the diffusion barrier layer formed over the I/O power source wiring region.

According to embodiments, an N-rich oxide layer may be formed at both of the I/O power source wiring region and the core power source wiring region.

According to embodiments, N-rich oxide layer 206 may be formed at an interface of the I/O power source wiring region and the device active region by the first annealing process. A trapping at an interface of oxide layers occurring in the related art may not occur. Since nitrogen N may be diffused to an interface of a device active region, a sufficient Si—N binding may be achieved to increase a stress reduction performance.

According to embodiments, because a growth of second oxide layer 208 may be suppressed by N-rich oxide layer 206 in the I/O power source wiring region, a thickness and a structure of an oxide layer in the I/O power source wiring region may be determined by first oxide layer 204 and a nitrogen N annealing.

According to embodiments, after doped polysilicon may be deposited as a conductive layer and a gate electrode may be formed by patterning and etching processes, a MOSFET may be completed through a series of processes, which may form LDD regions, spacers, and source/drain (S/D).

According to embodiments, after a first oxide layer grows, an annealing process may be performed under a nitrogen N atmosphere to form an N-rich oxide layer at an interface between the first oxide layer and a device active region. This may suppress a subsequent growth of an oxide layer.

According to embodiments, after a formation of a first oxide layer in the I/O power source wiring region, a first nitrogen N annealing may be performed to prevent an occurrence of a stress in the device active region during a formation of the gate oxide layer in the I/O power source wiring region. Further, a sufficient amount of nitrogen N may be diffused to an interface between an oxide layer and a device active region to easily obtain a Si—N binding. This may prevent an interface segregation of an active device ion due to the stress to maintain transistor characteristics, and prevent an HCL degradation occurring due to the interface instability.

It will be apparent to those skilled in the art that various modifications and variations may be made to embodiments. Thus, it may be intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A device comprising:
    a semiconductor substrate including an input/output power source wiring region and a core power source wiring region;
    a first nitrogen-rich oxide layer formed on the semiconductor substrate over the input/output power source wiring region;
    a first oxide layer formed over the first nitrogen-rich oxide layer to have a first height;
    a second nitrogen-rich oxide layer formed on the semiconductor substrate over the core power source wiring region; and
    a second oxide layer formed over the second nitrogen-rich oxide layer to have a second height, the second height not equal to the first height,
    wherein the second oxide layer and the second nitrogen-rich oxide layer are at a position lower than the first oxide layer and the first nitrogen-rich oxide layer and the top surface of the second oxide layer is in substantially a same plane as a bottom surface of the first nitrogen-rich oxide layer.

2. The device of claim 1, wherein the first height is greater than the second height.

3. The device of claim 2, wherein the first nitrogen-rich oxide layer is directly on a surface of the semiconductor substrate, and wherein the second nitrogen-rich oxide layer is directly on a surface of the semiconductor substrate.

4. The device of claim 3, wherein the first nitrogen-rich oxide layer is formed by a first annealing process, and wherein the second nitrogen-rich oxide layer is formed by a second annealing process.

5. The device of claim 4, wherein the first nitrogen-rich oxide layer oxide layer is configured to suppress formation of the second oxide layer in the input/output power source wiring region.

6. The device of claim 1, further comprising an isolation region separating the input/output power source wiring region and the core power source wiring region.

7. The device of claim 1, wherein the first nitrogen-rich oxide layer and the first oxide layer formed to have the first height are formed above a first level with respect to a bottom surface of the semiconductor substrate, and wherein the second nitrogen-rich oxide layer and the second oxide layer formed to have the second height are formed to be below the first level.

8. The device of claim 1, wherein the second nitrogen-rich oxide layer comprises a Nitrogen-rich oxide (NO) gate oxide layer.

* * * * *